United States Patent
Bilski

(10) Patent No.: US 10,209,003 B2
(45) Date of Patent: Feb. 19, 2019

(54) ELECTRONICS CABINET AND RACK COOLING SYSTEM AND METHOD

(71) Applicant: Thermal Corp., Wilmington, DE (US)

(72) Inventor: W. John Bilski, Mohnton, PA (US)

(73) Assignee: Thermal Corp., Wilmington, DE (US)

( * ) Notice: Subject to any disclaimer, the term of this patent is extended or adjusted under 35 U.S.C. 154(b) by 490 days.

(21) Appl. No.: 13/772,606

(22) Filed: Feb. 21, 2013

(65) Prior Publication Data

US 2013/0213075 A1 Aug. 22, 2013

Related U.S. Application Data

(60) Provisional application No. 61/601,227, filed on Feb. 21, 2012.

(51) Int. Cl.
| | |
|---|---|
| F25D 31/00 | (2006.01) |
| F28D 15/02 | (2006.01) |
| F28F 1/32 | (2006.01) |
| H05K 7/20 | (2006.01) |

(52) U.S. Cl.
CPC ......... *F25D 31/00* (2013.01); *F28D 15/0266* (2013.01); *F28D 15/0275* (2013.01); *F28F 1/32* (2013.01); *H05K 7/20645* (2013.01)

(58) Field of Classification Search
CPC ......... H05K 7/20336; H05K 70/20663; H05K 7/20681; H05K 7/20818; H05K 7/20645; F25D 31/00; F28D 15/0266; F28D 15/0275; F28F 1/32
USPC .............. 62/119, 259.2; 165/104.21, 104.26, 165/104.33, 104.34; 361/701, 702, 703, 361/690, 694
See application file for complete search history.

(56) References Cited

U.S. PATENT DOCUMENTS

| | | | |
|---|---|---|---|
| 3,317,798 A | 5/1967 | Chu et al. | |
| 3,387,648 A | 6/1968 | Ward, Jr. et al. | |
| 4,306,613 A * | 12/1981 | Christopher | F25B 23/006 165/10 |
| 4,323,914 A | 4/1982 | Berndlmaier et al. | |
| 4,366,526 A | 12/1982 | Lijoi et al. | |
| 4,449,576 A * | 5/1984 | Baum | H05K 7/20672 165/104.14 |
| 4,546,619 A * | 10/1985 | Rohner | H05K 7/20354 165/80.4 |
| 4,602,679 A | 7/1986 | Edelstein et al. | |

(Continued)

FOREIGN PATENT DOCUMENTS

| | | | |
|---|---|---|---|
| CA | 2261554 A1 * | 9/1999 | H04B 1/036 |
| JP | 9069595 | 3/1997 | |
| SU | 788461 | 12/1980 | |

*Primary Examiner* — Ljiljana Ciric
*Assistant Examiner* — Kirstin Oswald
(74) *Attorney, Agent, or Firm* — Michael, Best & Friedrich LLP

(57) ABSTRACT

A thermal management system for a electronics cabinets having an electronics heat source therein. The thermal management system includes a first passive thermal device having an evaporator portion and a condenser portion. The thermal management system can also include a heat sink in contact with air inside the cabinet and in thermal contact with the evaporator portion of the first passive thermal device, wherein the heat sink is contained within the sealed cabinet. The condenser portion of the first passive thermal device can be in contact with a liquid to liquid heat exchanger.

22 Claims, 4 Drawing Sheets

(56) References Cited

U.S. PATENT DOCUMENTS

| | | | |
|---|---|---|---|
| 4,612,978 A | 9/1986 | Cutchaw | |
| 4,777,561 A * | 10/1988 | Murphy | H05K 7/20681 |
| | | | 165/80.4 |
| 4,793,405 A | 12/1988 | Diggelmann et al. | |
| 4,819,713 A | 4/1989 | Weisman | |
| 4,903,761 A | 2/1990 | Cima | |
| 4,931,905 A | 6/1990 | Cirrito et al. | |
| 4,941,530 A | 7/1990 | Crowe | |
| 4,949,164 A | 8/1990 | Ohashi et al. | |
| 5,003,376 A | 3/1991 | Iversen | |
| 5,057,968 A | 10/1991 | Morrison | |
| 5,063,475 A | 11/1991 | Balan | |
| 5,077,601 A | 12/1991 | Hatada et al. | |
| 5,150,278 A | 9/1992 | Lynes et al. | |
| 5,201,364 A | 4/1993 | Tippmann et al. | |
| 5,203,399 A | 4/1993 | Koizumi | |
| 5,224,016 A | 6/1993 | Weisman et al. | |
| 5,232,277 A * | 8/1993 | Cassady | E05D 5/065 |
| | | | 16/221 |
| 5,283,715 A | 2/1994 | Carlsten et al. | |
| 5,329,425 A | 7/1994 | Leyssens et al. | |
| 5,343,940 A * | 9/1994 | Jean | F28D 15/0241 |
| | | | 165/104.33 |
| 5,361,188 A | 11/1994 | Kondou et al. | |
| 5,394,936 A | 3/1995 | Budelman | |
| 5,404,272 A | 4/1995 | Lebailly et al. | |
| 5,424,916 A | 6/1995 | Martin | |
| 5,513,071 A | 4/1996 | LaViolette et al. | |
| 5,574,627 A | 11/1996 | Porter | |
| 5,587,880 A | 12/1996 | Phillips et al. | |
| 5,613,552 A | 3/1997 | Osakabe et al. | |
| 5,713,413 A | 2/1998 | Osakabe et al. | |
| 5,720,338 A | 2/1998 | Larson et al. | |
| 5,725,049 A | 3/1998 | Swanson et al. | |
| 5,801,632 A * | 9/1998 | Opal | H04M 11/04 |
| | | | 340/585 |
| 5,829,516 A | 11/1998 | Lavochkin | |
| 5,832,989 A | 11/1998 | Osakabe et al. | |
| 5,836,381 A | 11/1998 | Osakabe et al. | |
| 5,884,693 A * | 3/1999 | Austin | A61B 8/546 |
| | | | 165/104.22 |
| 5,890,371 A | 4/1999 | Rajasubramanian et al. | |
| 5,953,930 A | 9/1999 | Chu et al. | |
| 6,055,157 A | 4/2000 | Bartilson et al. | |
| 6,076,595 A | 6/2000 | Austin et al. | |
| 6,084,772 A * | 7/2000 | Pell | H05K 7/20681 |
| | | | 165/104.21 |
| 6,104,611 A * | 8/2000 | Glover | F28D 15/06 |
| | | | 165/104.33 |
| 6,209,631 B1 * | 4/2001 | Garcia-Ortiz | F28D 15/02 |
| | | | 165/104.33 |
| 6,223,810 B1 * | 5/2001 | Chu | F28D 15/0266 |
| | | | 165/104.26 |
| 6,360,813 B1 | 3/2002 | Katoh et al. | |
| 6,388,882 B1 | 5/2002 | Hoover et al. | |
| 6,397,931 B1 | 6/2002 | Lin et al. | |
| 6,536,510 B2 | 3/2003 | Khrustalev et al. | |
| 6,621,713 B2 | 9/2003 | Amaike et al. | |
| 6,643,132 B2 | 11/2003 | Faneuf et al. | |
| 6,657,121 B2 | 12/2003 | Garner | |
| 6,761,212 B2 | 7/2004 | DiPaolo | |
| 6,804,117 B2 | 10/2004 | Phillips et al. | |
| 6,819,563 B1 * | 11/2004 | Chu | G11B 33/1406 |
| | | | 165/104.33 |
| 6,828,675 B2 | 12/2004 | Memory et al. | |
| 7,245,485 B1 | 7/2007 | Morrell | |
| 7,385,810 B2 | 6/2008 | Chu et al. | |
| 7,505,269 B1 * | 3/2009 | Cosley | F28D 15/02 |
| | | | 165/104.33 |
| 7,522,418 B2 | 4/2009 | Ishimine | |
| 7,586,741 B2 | 9/2009 | Matsushima et al. | |
| 7,631,687 B2 | 12/2009 | Yang et al. | |
| 7,855,890 B2 * | 12/2010 | Kashirajima | F25B 25/00 |
| | | | 361/679.46 |
| 2003/0010477 A1 * | 1/2003 | Khrustalev | F28D 15/0266 |
| | | | 165/104.33 |
| 2003/0057546 A1 * | 3/2003 | Memory | H05K 7/20681 |
| | | | 257/706 |
| 2003/0107873 A1 * | 6/2003 | Van Gaal | H05K 7/206 |
| | | | 361/690 |
| 2003/0147216 A1 * | 8/2003 | Patel | H05K 7/20754 |
| | | | 361/700 |
| 2004/0065111 A1 * | 4/2004 | Monfarad | F25B 1/00 |
| | | | 62/498 |
| 2004/0085733 A1 * | 5/2004 | Leon | H05K 7/20336 |
| | | | 361/700 |
| 2004/0206479 A1 * | 10/2004 | Kroliczek | F25B 23/006 |
| | | | 165/104.21 |
| 2004/0268404 A1 * | 12/2004 | Gray | H04N 21/235 |
| | | | 725/112 |
| 2005/0024831 A1 * | 2/2005 | Phillips | F28D 15/025 |
| | | | 361/700 |
| 2005/0067147 A1 * | 3/2005 | Thayer | F25B 23/006 |
| | | | 165/80.4 |
| 2007/0042514 A1 | 2/2007 | Wu et al. | |
| 2007/0235167 A1 * | 10/2007 | Brewer | G06F 1/20 |
| | | | 165/104.33 |
| 2008/0112128 A1 | 5/2008 | Holland | |
| 2008/0212282 A1 | 9/2008 | Young | |
| 2009/0154096 A1 * | 6/2009 | Iyengar | H05K 7/20754 |
| | | | 361/694 |
| 2009/0224639 A1 * | 9/2009 | Sosin | H04Q 1/10 |
| | | | 312/223.1 |
| 2009/0268404 A1 * | 10/2009 | Chu | H05K 7/20745 |
| | | | 361/696 |
| 2010/0326628 A1 * | 12/2010 | Campbell | F28D 15/02 |
| | | | 165/104.21 |
| 2011/0317367 A1 * | 12/2011 | Campbell | H05K 7/20809 |
| | | | 361/700 |

* cited by examiner

ELECTRONICS CABINET AND RACK COOLING SYSTEM AND METHOD

CROSS-REFERENCE TO RELATED APPLICATIONS

This application claims priority to U.S. Provisional Patent Application No. 61/601,227 filed Feb. 21, 2012, the content of which is incorporated herein by reference in its entirety.

BACKGROUND

With increasingly powerful computers and other electronics components being made in smaller packages, management of heat in electronics systems is increasingly important for preventing equipment from overheating and failing. Many electronics racks are maintained in sealed cabinets (e.g. according to standards such as NEMA 4 or NEMA 12) in order to keep out dust and dirt, which means that heat must be removed from the cabinets without introducing dust and dirt into the cabinet. While some solutions have been offered in these and other electronics cabinet and rack environments, better systems are still needed to remove heat from such within such structures, particularly from the air therein. As used herein for ease of description, the term "cabinet" refers to electronics cabinets, racks, and enclosures that in some cases are sealed.

SUMMARY

In some embodiments, a thermal management system for an electronics cabinet having a electronics heat source therein is provided, and includes a first passive thermal device having an evaporator portion, a condenser portion, and a working fluid contained therein; and a heat sink in contact with air inside the cabinet and in thermal contact with the evaporator portion of the first passive thermal device, the heat sink being contained within the sealed cabinet, wherein the condenser portion of the first passive thermal device is in contact with a liquid to liquid heat exchanger.

Some embodiments of the present invention provide a thermal management system for an electronics cabinet having an electronics heat source therein, wherein the thermal management system includes a thermal bus at least partially contained within the sealed cabinet; and a heat sink disposed within the sealed cabinet, wherein the heat sink has a first passive thermal device thermally coupled thereto, the first passive thermal device having an evaporator portion, a condenser portion, and a working fluid contained therein, and wherein the evaporator portion is thermally coupled to the heat sink and the condenser portion is configured to transfer heat out of the cabinet using the thermal bus.

Other aspects of the invention will become apparent by consideration of the detailed description and accompanying drawings.

DETAILED DESCRIPTION

Figure 1:
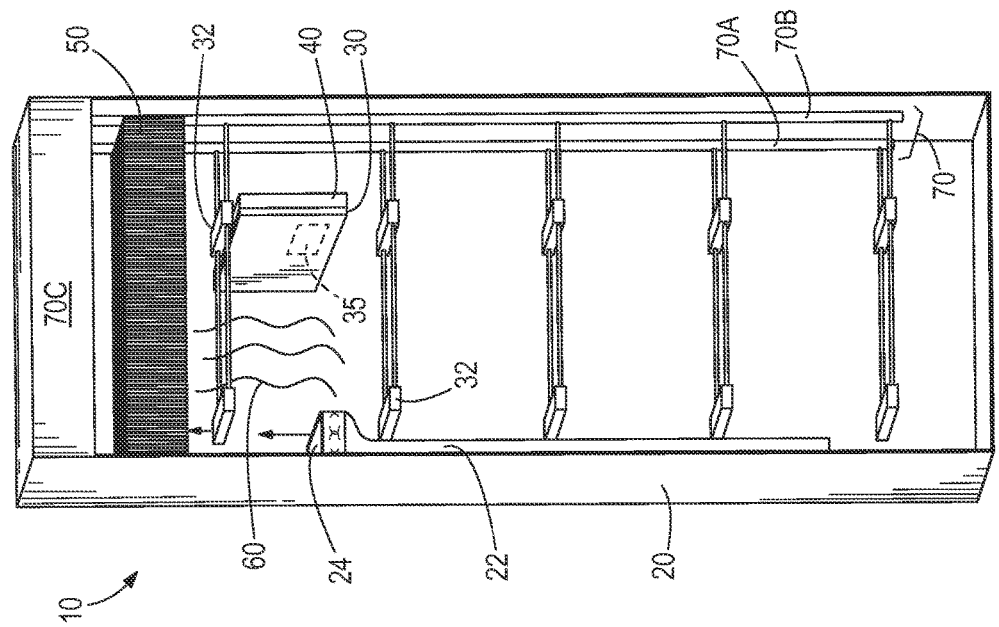
FIG. 1 shows a sealed cabinet having an electronics thermal management system according to an embodiment of the invention.

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways.

In various embodiments, the invention provides a thermal management system 10 for a cabinet 20, where the cabinet 20 is designed to house an electronics heat source 30 such as a printed circuit board. In some embodiments, the cabinet 20 is sealed to prevent ingress of air into the cabinet 20 from the outside environment and/or discharge of air from within the cabinet 20 to the outside environment. Also, in some embodiments, the thermal management system 10 includes one or more card shells 40 or other devices to which the electronics heat source 30 is attached and/or within which the electronics heat source 30 is held. The illustrated card shells 40 are thermally coupled to point sources 35 of heat on the heat source 30, such as a microprocessor containing densely-packed integrated circuits, a transformer, or other heat-generating electronics devices. On the card shells 40, heat may be transferred from one or more point sources 35 by active mechanisms such as a chilled liquid loop or by one or more types of passive thermal device, for example by one or more heat pipes, as shown in U.S. Pat. No. 6,804,117 (incorporated by reference herein), or by one or more loop thermosyphons, as shown in the '117 patent as well as in U.S. Pat. No. 6,828,675 (incorporated by reference herein), or by combinations of these mechanisms.

Figure 2:
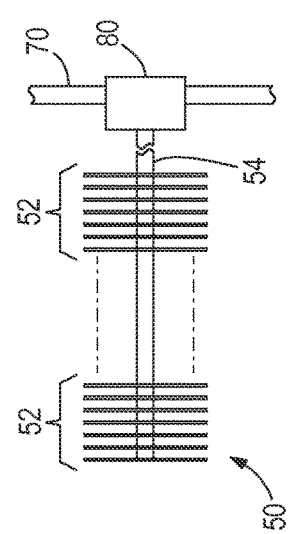
FIG. 2 shows a side view of an air to liquid heat exchanger for use in a thermal management system.

Heat pipes (see FIG. 2 of the '117 patent) and thermosyphons (see FIG. 7 of the '117 patent and FIG. 2 of the '675 patent) are passive thermal devices that include an evaporator portion and a condenser portion, which in some embodiments are joined by a variable-length connecting portion that is not adapted to serve as a condenser or evaporator. In other embodiments, the evaporator portion is connected directly to the condenser portion. Heat pipes and thermosyphons are generally sealed tubes or other types of sealed compartments which contain a small amount of working fluid inside. The heat source 30 is thermally coupled to the evaporator portion such that the working fluid inside the tube evaporates, transferring the heat to the working fluid to produce vapor. The working fluid vapor then migrates to the condenser portion where it condenses and transfers the heat to the condenser portion of the heat pipe or thermosyphon. The condenser portion of the heat pipe or thermosyphon is thermally coupled to a heat transfer mechanism. The heat transfer mechanism may transfer the heat to the air, such as with a liquid to air (e.g. fins) heat exchanger, or to another stage such as a liquid to liquid heat exchanger, which can include a chilled liquid system or another passive device such as a heat pipe or thermosyphon.

In some embodiments, the evaporator and condenser portions of the passive thermal device are joined or linked by a connecting portion. The connecting portion may be a single line (as in the case of a heat pipe) or a pair of lines (as in a thermosyphon or a loop heat pipe), where condensed liquid and/or evaporated vapor migrates through the connecting portion so as to move between the evaporator and condenser portions of the device.

Thermosyphons typically are closed loops which take advantage of a siphoning effect of the condensed working fluid to help fluid and vapor circulate through the system. Heat pipes typically are tubes with two ends and a wick material on the inside surface to increase the surface area for evaporation, although heat pipes may also be loops. Heat pipes and thermosyphons may be constructed of various heat-conducting materials such as copper or aluminum. The working fluid may be (for example) water, ethanol, methanol, acetone, sodium, or mercury, and the interior of the heat pipe or thermosyphon is typically evacuated so that the only gas in the interior is the working fluid vapor.

In general, the passive thermal device (e.g. the heat pipe or thermosyphon) removes heat through direct contact with the point source 35 of heat. However, even with the removal of heat from the major, discrete point sources 35 such as microprocessors (which may account for 50%-80% of the heat generated on a printed circuit board), heat tends to build up in cabinets 20. Typically, this additional heat is produced by numerous smaller and more dispersed sources of heat in the cabinet 20, for example from smaller components on the various printed circuit boards. This additional heat in the air inside the cabinet 20 must often be removed in order to prevent overheating and possible malfunction of the electronics or other equipment inside the cabinet 20.

Thus, various embodiments the thermal management system 10 include an air to liquid heat exchanger 50 within the cabinet 20 to passively capture heat from the air and remove such heat from the cabinet 20—in some embodiments without compromising the seal on the cabinet 20 (FIG. 1). In some embodiments, the heat exchanger 50 includes a heat sink 52 (e.g. one or more fins) coupled in a thermally conductive manner to an evaporator portion of a passive thermal device 54 such as a thermosyphon or a heat pipe (see FIG. 2; note that, for clarity, not all of the fins are shown). In various embodiments, the heat sink 52 is located in an upper portion of the cabinet 20 in order to interact with warm air 60 that rises to the top of the cabinet 20. In those embodiments in which the heat sink 52 includes fins, the fins 52 may be vertically-oriented such that the warm air 60 readily comes into contact with and transfers its heat to the heat sink 52 (e.g. fins 52). In various embodiments, the cabinet 20 may include ducting 22 and/or air-moving devices 24 such as fans to promote movement of air through the cabinet 20 and across the heat sink 52 (e.g. fins). In some embodiments (e.g. FIGS. 2, 3A, 3B), the condenser portion of the passive thermal device 54 (e.g. the thermosyphon or heat pipe) is thermally coupled to a thermal bus 70 at a junction 80, which may be located inside or outside of the cabinet 20.

Figure 4:
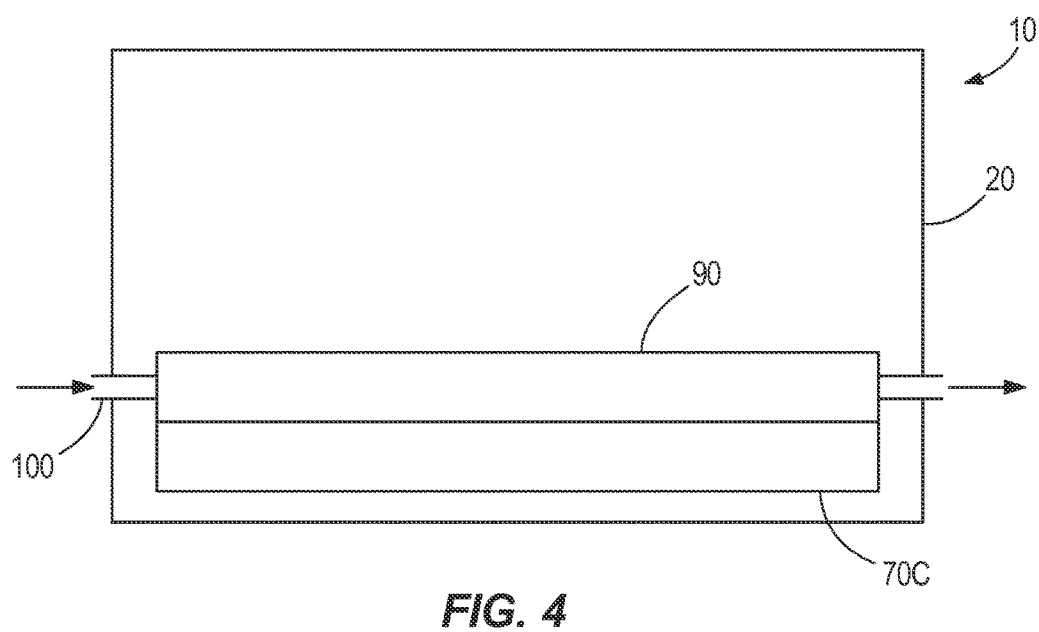
FIG. 4 shows a top view of the top portion of the sealed cabinet.

The thermal bus 70 is a mechanism for moving heat from one area of the cabinet 20 to another, or from an area within the cabinet 20 to outside of the cabinet 20. In various embodiments, the thermal bus 70 includes one or more lines to carry heat from the inside to the outside of the cabinet 20 (e.g., a sealed cabinet 20). In some embodiments, the thermal bus 70 is a passive device such as a thermosyphon, and includes one or more pairs of lines 70A, 70B. In such embodiments, one thermal bus line 70A can deliver fluid to one or more of the various connected components, and the other thermal bus line 70B can carry vapor away from the components and towards a condenser region 70C (see FIG. 1). In some embodiments, the condenser region 70C of the thermal bus 70 is outside of the cabinet 20 or is outside of a sealed portion of the cabinet 20, such as at the top of the cabinet 20 (FIG. 1), and can be configured to transfer its heat to the ambient air or to a liquid such as a chilled liquid loop or another thermosyphon loop. In various embodiments, there may be multiple thermal bus lines 70A, 70B, although only a single set of lines is shown in the figures for clarity. In certain embodiments, the condenser regions 70C of one or more sets of thermal bus lines 70A, 70B are disposed adjacent a cold plate 90 through which fluid in an external heat transfer mechanism 100 (such as a chilled liquid loop) circulates in the top portion of the cabinet 20 (FIG. 4). In these embodiments, the condenser regions 70C can be embedded in a conductive plate adjacent the cold plate 90, or can be otherwise placed in thermal contact with the cold plate 90. Although FIG. 4 shows only one condenser region 70C and cold plate 90, multiple pairs of condensers and cold plates may be housed in the top portion of the sealed cabinet 20. In certain embodiments where heat is transferred to an external heat transfer mechanism 100 such as a chilled liquid loop (e.g. as in FIG. 4), the condenser region 70C of the thermal bus 70 may be contained within the sealed region of the sealed cabinet 20.

In some embodiments, the thermal bus 70 is a chilled liquid loop, and heat is transferred at the junction 80 from the heat pipes 54 or thermosyphon 54' to the chilled liquid. In such embodiments, the thermal bus lines 70A, 70B can carry chilled liquid towards the junction 80, and can also carry warmed liquid away from the junction 80. Also in such embodiments, there may be a single set of thermal bus lines 70A, 70B which act as manifolds to deliver chilled liquid to multiple junctions 80, or there may be a separate set of thermal bus lines 70A, 70B for each junction 80. In various embodiments, the chilled liquid loop thermal bus 70 may be part of a room-wide or building-wide chiller system which ultimately transfers its heat out of the room and/or building.

Figure 3A:
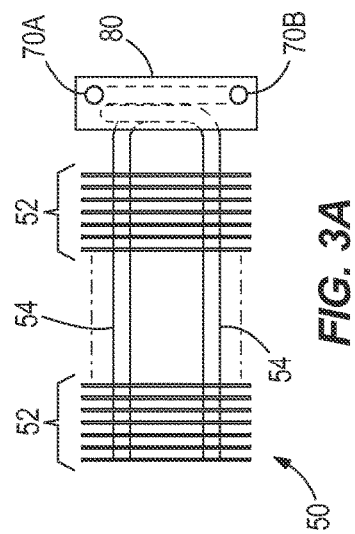
FIG. 3A shows a top view of an air to liquid heat exchanger using heat pipes and showing a junction with a thermal bus.

FIG. 3A shows a top view of an embodiment of a junction 80 between a passive thermal device 54 and a thermal bus 70. In this embodiment, the passive thermal device 54 consists of one or more heat pipes 54, which are coupled to a plurality of fins 52 in the evaporator portion of the heat pipes 54. The condenser portions of the one or more heat pipes 54 are thermally coupled at the junction 80 to the thermal bus 70, for example by a metal connection.

Figure 3B:
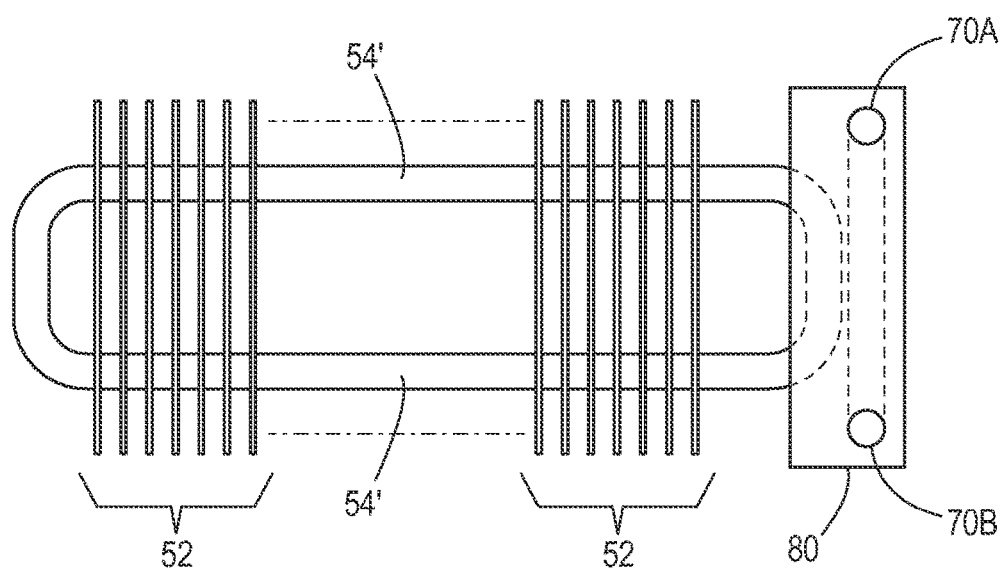
FIG. 3B shows a top view of an air to liquid heat exchanger using a thermosyphon and showing a junction with a thermal bus.

FIG. 3B shows a top view of another embodiment of a junction 80 between a passive thermal device 54 and a thermal bus 70. In this embodiment, the passive thermal device 54 is a thermosyphon 54' which is coupled to a plurality of fins 52 in the evaporator portion of the thermosyphon 54'. The condenser portion of the thermosyphon 54' is thermally coupled at the junction 80 to the thermal bus 70, for example by a metal connection. In various embodiments, the junction 80 may be located outside of the sealed cabinet 20.

Figure 3C:
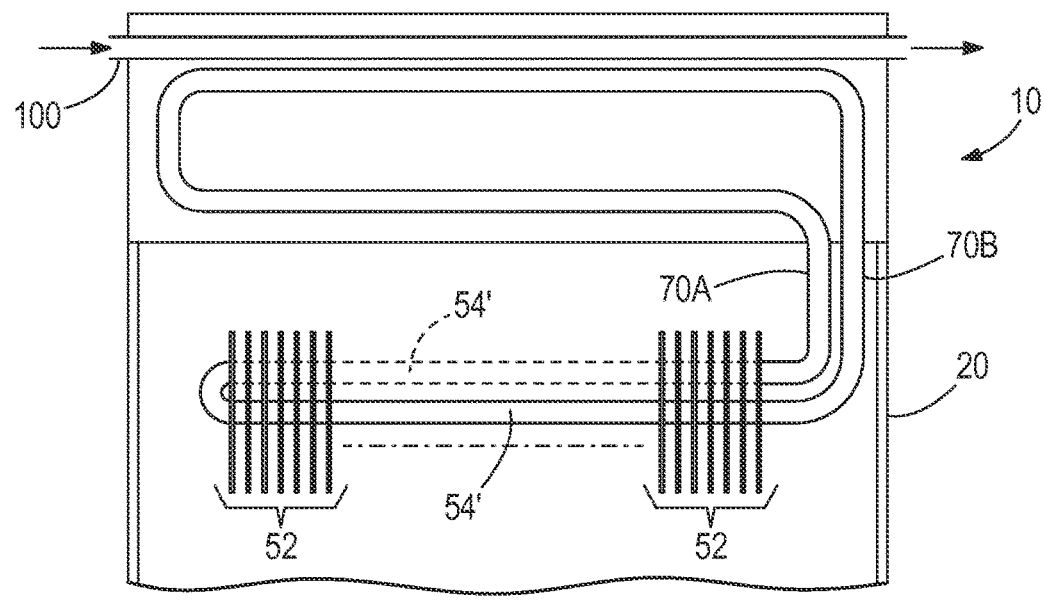
FIG. 3C shows a side view of an air to liquid heat exchanger using a thermosyphon which is thermally coupled to an external chilled liquid loop.
Figure 3D:
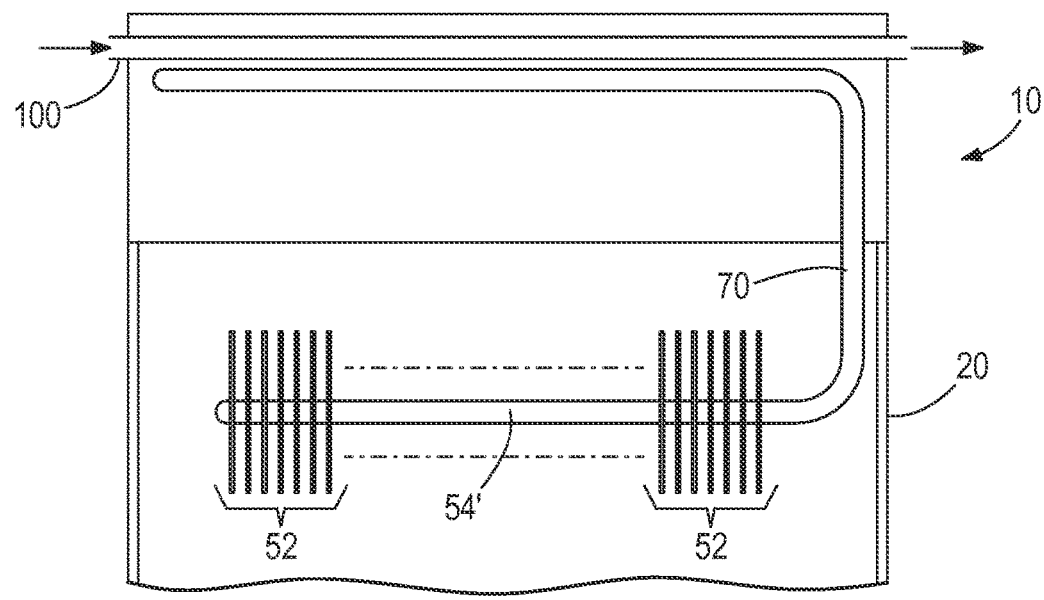
FIG. 3D shows a side view of an air to liquid heat exchanger using a heat pipe which is thermally coupled to an external chilled liquid loop.

FIG. 3C shows a side view of another embodiment in which the passive thermal device 54 is a loop thermosyphon 54', and in which the evaporator portion is inside the cabinet (or inside a sealed portion of the cabinet 20) and is thermally coupled to a plurality of fins 52, whereas the condenser portion is in thermal contact with the external heat transfer mechanism 100 (e.g. chilled liquid loop) inside or outside of the cabinet 20 (or sealed portion thereof). In such embodiments, the junction 80 can be omitted, the connecting portions between the evaporator portion and condenser portion of the thermosyphon 54' serve as the vapor 70B and fluid 70A lines, and the condenser portion of the thermosyphon 54' serves as the condenser region 70C of the thermal bus 70. In still other embodiments, one or more heat pipes 54' are used for the passive thermal device 54 (FIG. 3D), in which case the connecting portion between the evaporator portion and condenser portion of each heat pipe 54' serves as the thermal bus 70 line(s), and the condenser portion of each heat pipe 54' serves as the condenser region 70C.

Thus, in each of the embodiments (FIGS. 3A, 3B, 3C, 3D), the condenser portion of the passive thermal device 54 is configured to transfer heat out of the cabinet 20. In embodiments such as those shown in FIGS. 3A and 3B, the condenser portion of the passive thermal device 54 is coupled to a junction 80 (either inside or outside of the cabinet 20) where heat from the passive thermal device 54 is transferred to the thermal bus 70. In embodiments such as those shown in FIGS. 3C and 3D, the functions of the thermal bus 70 are served by the passive thermal device 54' themselves, such that the evaporator and condenser portions and the intervening vapor and fluid line(s) of the passive thermal device 54' are equivalent to the evaporator, condenser, and fluid/vapor lines of the thermal bus 70.

Thus, the invention provides, among other things, a passive thermal management system for electronics cabinets. Various features and advantages of the invention are set forth in the following claims.

What is claimed is:

1. A thermal management system for an electronics cabinet having an electronics heat source within the cabinet, the thermal management system comprising:
a first passive thermal device within the electronics cabinet having an evaporator portion, a condenser portion, and a working fluid contained within the first passive thermal device, wherein the evaporator portion is not in direct contact with any electronics heat source and the cabinet is sealed to prevent ingress of air into the cabinet from an outside environment and discharge of air from within the cabinet to the outside environment; and
a heat sink in contact with air inside the cabinet and in thermal contact with the evaporator portion of the first passive thermal device, the heat sink being contained within the sealed cabinet and positioned to passively capture heat generated by the electronics heat source from the air inside the sealed cabinet, where the heat sink is directly thermally coupled to the evaporator portion of the first passive thermal device to transfer the captured heat generated by the electronics heat source to the evaporator portion of the first passive thermal device, and the evaporator portion of the first thermal device is thermally coupled to the condenser portion of the first passive thermal device to transfer the captured heat generated by the electronics heat source to the condenser portion of the first passive thermal device,
wherein the condenser portion of the first passive thermal device is in thermal contact with a liquid to liquid heat exchanger to transfer the captured heat generated by the electronics heat source to the liquid to liquid heat exchanger.

2. The thermal management system of claim 1, wherein the heat sink comprises a plurality of fins.

3. The thermal management system of claim 2, wherein the fins are vertically oriented.

4. The thermal management system of claim 1, wherein the first passive thermal device is a thermosyphon.

5. The thermal management system of claim 1, wherein the liquid to liquid heat exchanger is a chilled liquid loop.

6. The thermal management system of claim 1, wherein the heat sink is disposed in an upper portion of the sealed cabinet.

7. The thermal management system of claim 1, further comprising a card shell directly coupled to the electronics heat source, wherein the card shell includes a second passive thermal device having an evaporator portion, a condenser portion, and a second working fluid contained within the second passive thermal device, the evaporator portion of the second passive thermal device being directly coupled to at least a portion of the electronics heat source, and wherein the condenser portion of the second passive thermal device is thermally coupled to the liquid to liquid heat exchanger.

8. The thermal management system of claim 7, wherein the second passive thermal device is a thermosyphon.

9. A thermal management system for an electronics cabinet having an electronics heat source within the cabinet, the thermal management system comprising:
a thermal bus at least partially contained within a cabinet; and
a heat sink disposed within the cabinet and in contact with air inside the cabinet, wherein the heat sink is positioned to passively capture heat generated by the electronics heat source from the air inside the cabinet, a first passive thermal device within the electronics cabinet and that is thermally coupled to the heat sink, the first passive thermal device having an evaporator portion that is not in direct contact with any electronics heat source, a condenser portion, and a working fluid contained within the first passive thermal device, wherein the evaporator portion is directly thermally coupled to the heat sink for transfer of the captured heat generated by the electronics heat source from the heat sink to the evaporator portion of the first passive thermal device and the condenser portion is configured and thermally coupled to the thermal bus to transfer heat received from the evaporator portion out of the cabinet through the transfer of heat to the thermal bus,
wherein the heat sink is not in direct contact with the electronics heat source.

10. The thermal management system of claim 9, wherein the condenser portion of the first passive thermal device is directly coupled to the thermal bus at a first thermal bus junction.

11. The thermal management system of claim 10, further comprising a card shell directly coupled to the electronics heat source, wherein the card shell includes a second passive thermal device directly coupled to at least a portion of the electronics heat source, and wherein the second passive thermal device of the card shell is thermally coupled to the thermal bus at a second thermal bus junction.

12. The thermal management system of claim 11, wherein the second passive thermal device comprises a heat pipe.

13. The thermal management system of claim 11, wherein the second passive thermal device comprises a thermosyphon.

14. The thermal management system of claim 10, wherein the first thermal bus junction is disposed entirely inside the cabinet.

15. The thermal management system of claim 9, wherein the thermal bus comprises a thermosyphon.

16. The thermal management system of claim 9, wherein the thermal bus comprises a chilled liquid loop.

17. The thermal management system of claim 9, wherein the heat sink comprises a plurality of fins.

18. The thermal management system of claim 17, wherein the fins are vertically oriented.

19. A thermal management system for an electronics cabinet sealed to prevent ingress of air into the cabinet from an outside environment and discharge of air from within the cabinet to the outside environment, an electronics heat source disposed within the cabinet, the thermal management system comprising:
- a first passive thermal device having an evaporator portion, a condenser portion, and a working fluid contained within the first passive thermal device; and
- a heat sink in contact with air inside the cabinet and in thermal contact with the evaporator portion of the first passive thermal device, the heat sink being contained within the sealed cabinet and positioned to passively capture heat generated by the electronics heat source from the air inside the cabinet, wherein the heat sink is directly thermally coupled to the evaporator portion of the first passive thermal device to transfer the heat generated by the electronics heat source to the working fluid in the evaporator portion of the first passive thermal device,
- wherein the condenser portion of the first passive thermal device is contained entirely within the sealed cabinet and in thermal contact with a liquid to liquid heat exchanger.

20. The thermal management system of claim 19, further comprising a card shell directly coupled to the heat source, wherein the card shell includes a second passive thermal device having an evaporator portion, a condenser portion, and a second working fluid contained within the second passive thermal device, the second passive thermal device being directly coupled to at least a portion of the electronics heat source, and wherein the condenser portion of the second passive thermal device is thermally coupled to the liquid to liquid heat exchanger.

21. A thermal management system for an electronics cabinet sealed to prevent ingress of air into the cabinet from an outside environment and discharge of air from within the cabinet to the outside environment and having an electronics heat source within the cabinet, the thermal management system comprising:
- a thermal bus at least partially contained within the sealed cabinet; and
- a heat sink disposed within the sealed cabinet and configured to interact with and contact air inside the cabinet heated by the electronics heat source, the heat sink having a first passive thermal device thermally coupled thereto, the first passive thermal device having an evaporator portion, a condenser portion contained within the sealed cabinet, and a working fluid contained within the first passive thermal device, wherein the heat sink is positioned within the electronics cabinet to passively capture heat generated by the electronics heat source from the air inside the cabinet, the evaporator portion is directly thermally coupled to the heat sink for the transfer of heat from the heat sink to the evaporator portion of the first passive thermal device, and the condenser portion is thermally coupled to the evaporator portion and the thermal bus, wherein the thermal bus is configured to transfer heat out of the cabinet,
- wherein the heat sink is not in direct contact with any electronics heat source.

22. The thermal management system of claim 21, further comprising a card shell directly coupled to the heat source, wherein the card shell includes a second passive thermal device having an evaporator portion, a condenser portion, and a second working fluid contained within the second passive thermal device, the second passive thermal device being directly coupled to at least a portion of the electronics heat source, and wherein the condenser portion of the second passive thermal device is thermally coupled to the liquid to liquid heat exchanger.

* * * * *